(12) United States Patent
Emoto (10) Patent No.: US 7,154,588 B2
(45) Date of Patent: Dec. 26, 2006

(54) ALIGNMENT APPARATUS AND EXPOSURE APPARATUS

(75) Inventor: Keiji Emoto, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/406,442

(22) Filed: Apr. 19, 2006

(65) Prior Publication Data

US 2006/0187437 A1  Aug. 24, 2006

Related U.S. Application Data

(62) Division of application No. 10/847,455, filed on May 18, 2004, now Pat. No. 7,053,982.

(30) Foreign Application Priority Data

Jun. 3, 2003  (JP)  ............................. 2003-158598

(51) Int. Cl.
*G03B 27/58* (2006.01)
*G03B 27/62* (2006.01)

(52) U.S. Cl. .......................... 355/72; 355/75
(58) Field of Classification Search ................ 355/53, 355/72, 75, 77
See application file for complete search history.

(56) References Cited

U.S. PATENT DOCUMENTS

| | | | |
|---|---|---|---|
| 5,260,580 A | 11/1993 | Itoh et al. ................. 250/492.2 |
| 6,080,039 A | 6/2000 | Bartlett et al. .................. 451/9 |
| 6,226,073 B1 | 5/2001 | Emoto .......................... 355/53 |
| 6,552,773 B1 | 4/2003 | Emoto .......................... 355/53 |
| 6,810,298 B1 * | 10/2004 | Emoto ......................... 700/121 |
| 6,990,386 B1 | 1/2006 | Tanaka et al. ............... 700/113 |
| 2001/0055102 A1 | 12/2001 | Emoto .......................... 355/53 |
| 2002/0081528 A1 | 6/2002 | Miyajima et al. ........... 430/302 |
| 2002/0088940 A1 | 7/2002 | Watanabe et al. ........... 250/310 |
| 2002/0132409 A1 | 9/2002 | Akutsu et al. .............. 438/200 |
| 2003/0035088 A1 | 2/2003 | Emoto .......................... 355/53 |
| 2003/0098962 A1 | 5/2003 | Kubo .......................... 355/72 |
| 2003/0098966 A1 | 5/2003 | Korenaga et al. ............. 355/75 |
| 2004/0080727 A1 | 4/2004 | Emoto .......................... 355/30 |

FOREIGN PATENT DOCUMENTS

| | | |
|---|---|---|
| JP | 2000-230178 | 8/2000 |
| JP | 3145355 | 1/2001 |
| JP | 2001-230178 | 8/2001 |
| JP | 200359797 | 2/2003 |

* cited by examiner

*Primary Examiner*—Rodney Fuller
(74) *Attorney, Agent, or Firm*—Fitzpatrick, Cella, Harper & Scinto (57) ABSTRACT

An alignment apparatus includes a first support member having a reference surface which movably supports an object, a driving unit which moves the object in at least one direction on the reference surface and aligns the object at a predetermined position, and a second support member which is provided separately from the first support member and supports a heating unit of the driving unit through a bearing.

7 Claims, 8 Drawing Sheets

FIG. 8
PRIOR ART ly supports an object, a driving unit
ALIGNMENT APPARATUS AND EXPOSURE APPARATUS This application is a divisional application of copending U.S. patent application Ser. No. 10/847,455, filed May 18, 2004.

FIELD OF THE INVENTION

The present invention relates to a technique for high-speed movement and precise alignment of a stage in a vacuum atmosphere or high-precision scan movement in a semiconductor exposure apparatus, an electron beam drawing apparatus, a precision instrument, or the like, for use in semiconductor device manufacture.

BACKGROUND OF THE INVENTION

Figure 8:
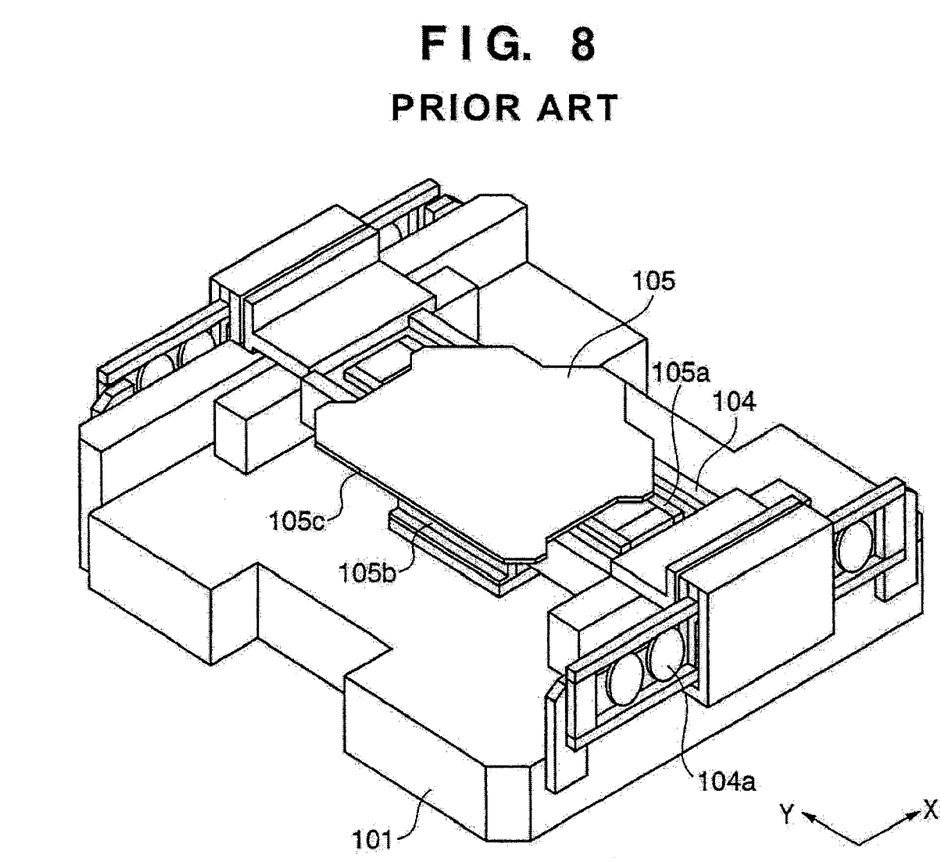
FIG. 8 is a perspective view of a conventional alignment apparatus.

Along with a recent increase in packing density and speed of semiconductor integrated circuits, the pattern line width of the integrated circuits is decreasing, and higher performance has been demanded for semiconductor manufacturing methods. Accordingly, as printing apparatuses (exposure apparatuses), ones using a KrF laser (248 nm), an ArF laser (193 nm), and an $F_2$ laser (157 nm), are under development. In recent years, there are being developed exposure apparatuses using EUV (Extreme UltraViolet) light, which is an exposure light having a wavelength far shorter (5 to 15 nm) than a conventional one. Electron beam (EB) exposure apparatuses using electron beams are also being developed increasingly. A wafer alignment apparatus employs an arrangement, as mainly disclosed in Japanese Patent No. 3,145,355, in which a Y stage 104 capable of moving in the Y-axis direction is arranged on a stage base 101, and an X stage 105 capable of moving in the X direction is arranged on the Y stage 104 (see FIG. 8).

Such an EUV or EB exposure apparatus is required to have a higher exposure accuracy, i.e., stage alignment precision. A stage serving as an alignment apparatus needs to be designed in the following manner.

(i) Since an allowance for a temperature change around a substrate is extremely limited, the substrate should be so arranged as to minimize heat transfer from a driving unit, or the like.

(ii) The substrate alignment precision should be increased, and moving members should be arranged in a noncontact manner so as to prevent contamination (dust) due to contact operation.

Under the current circumstances, heat generated in each driving unit becomes larger due to an increase in mass of a moving member and demands for higher acceleration. In a conventional alignment apparatus (FIG. 8) disclosed in Japanese Patent No. 3,145,355, the driving units (a stator 105*a* and movable element 105*b*) of the X stage 105 are arranged in the immediate vicinity of a substrate to be aligned and are susceptible to heat generated in these driving units. Also, the driving units of the X stage 105 are arranged on the Y stage 104, and the X stage 105 is guided by the Y stage 104 through hydrostatic bearings. For this reason, heat may be transmitted from the driving units (stators 104*a* as coils) on the Y stage 104 to the substrate support member 105*c*, without any heating element.

Conventionally, temperature-controlled air is blown around a substrate to control the temperature of a substrate support member, thereby suppressing influences of heat generation in a driving unit. However, an alignment apparatus for use in an EUV or EB exposure apparatus is arranged in a vacuum atmosphere free from heat transfer to a gas, and thus, it is impossible to perform temperature control by air conditioning. Accordingly, stage arrangements for suppressing to the utmost influences of heat generation in a driving unit have been demanded.

SUMMARY OF THE INVENTION

The present invention has been made in consideration of the above-mentioned problem, and has as its object to eliminate influences of heat generation in a driving unit in a vacuum atmosphere and to increase the alignment precision.

To solve the problem and to attain the object, an alignment apparatus according to the first aspect of the present invention comprises a first support member having a reference surface, which movably supports an object, a driving unit which moves the object in at least one direction on the reference surface and aligns the object at a predetermined position, and a second support member which is provided separately from the first support member and supports a heating unit of the first driving unit through a bearing. According to the first aspect, the alignment precision can be increased by eliminating influences of heat operation in the driving unit in a vacuum atmosphere.

In the alignment apparatus according to the second aspect of the present invention, in the first aspect, the driving unit comprises a first driving unit which moves the object in a first direction, and a second driving unit which moves the object in a second direction substantially perpendicular to the first direction, the first support member supports the object so as to allow the object to move in the first and second directions, and the second support member supports the first and second driving units.

The alignment apparatus according to the third aspect of the present invention, in the second aspect, the first driving unit has a first movable element, which moves the object in the first direction and a first stator which applies a driving force to the first movable element, the second driving unit has a second movable element which moves the object in the second direction and a second stator which applies a driving force to the second movable element, the bearing has a hydrostatic bearing, and the first and second stators are supported on the second support member through the hydrostatic bearing.

According to the second and third aspects, dissipation of heat generated in heating units in the first and second driving units to the second support member and cooling of the hydrostatic bearing by adiabatic expansion can be expected.

In the alignment apparatus according to the fourth aspect of the present invention, in the second or third aspect, the object is guided by a magnetic force in a noncontact manner with respect to the first and second driving units. According to the fourth aspect, a heat flow from the first and second driving units to the object can be suppressed.

In the alignment apparatus according to the fifth aspect of the present invention, in any one of the second to fourth aspects, at least one hydrostatic bearing is provided between the object and the first movable element in the first driving unit and/or between the object and the second movable element in the second driving unit, and the first driving unit and/or the second driving unit is supported by the hydrostatic bearing.

In the alignment apparatus according to the sixth aspect of the present invention, in the fifth aspect, the hydrostatic bearing is arranged such that a thermal resistance from the hydrostatic bearing which supports the first and/or second driving unit to the object is larger than a thermal resistance from the hydrostatic bearing to the first and/or second movable element.

According to the fifth and sixth aspects, a temperature rise can be reduced in portions of the first and second driving units, which oppose the object. That is, heat transfer to the object can be suppressed.

The alignment apparatus according to the seventh aspect of the present invention, in any one of the first to sixth aspects, further comprises a cooling unit which cools at least the second support member. According to the seventh aspect, heat transfer to the object can further be suppressed.

The alignment apparatus according to the eighth aspect of the present invention, in any one of the first to seventh aspects, is arranged in a vacuum atmosphere. According to the eighth aspect, the alignment apparatus can be used in a vacuum atmosphere to promote the above-mentioned effects.

An exposure apparatus according to the ninth aspect of the present invention comprises an alignment apparatus as defined in any one of the first to eighth aspects, wherein the alignment apparatus aligns at least one of a substrate and a master and exposes the substrate to a pattern on the master. According to the ninth aspect, the alignment precision of the substrate, or the like, can be increased by eliminating influences of heat generation in the driving unit in a vacuum atmosphere. An exposure apparatus using the above-mentioned alignment apparatus can increase the exposure accuracy.

In the alignment apparatus according to the tenth aspect of the present invention, in the ninth aspect, a fine movement alignment apparatus, which aligns one of the substrate and the master at a higher precision than the object, is arranged on the object. According to the tenth aspect, the alignment precision of the substrate or master can be increased.

In the alignment apparatus according to the eleventh aspect of the present invention, in the tenth aspect, the fine adjustment alignment apparatus is driven in a noncontact manner with respect to the object. According to the eleventh aspect, heat transfer from the object to the fine adjustment alignment apparatus can be suppressed, and the alignment precision can further be increased.

As described above, according to the present invention, an alignment apparatus can be arranged so as to be hardly influenced by heat generation in a driving unit in a vacuum atmosphere, and the alignment precision can be increased. An application of such an alignment apparatus to an exposure apparatus for use in semiconductor device manufacture can increase the exposure accuracy.

Other objects and advantages besides those discussed above shall be apparent to those skilled in the art from the description of a preferred embodiment of the invention which follows. In the description, reference is made to the accompanying drawings, which form a part thereof, and which illustrate an example of the invention. Such an example, however, is not exhaustive of the various embodiments of the invention, and, therefore, reference is made to the claims which follow the description for determining the scope of the invention.

DETAILED DESCRIPTION OF THE PREFERRED EMBODIMENTS

Embodiments of the present invention will be described below in detail with reference to the accompanying drawings.

[First Embodiment]

Figure 1:
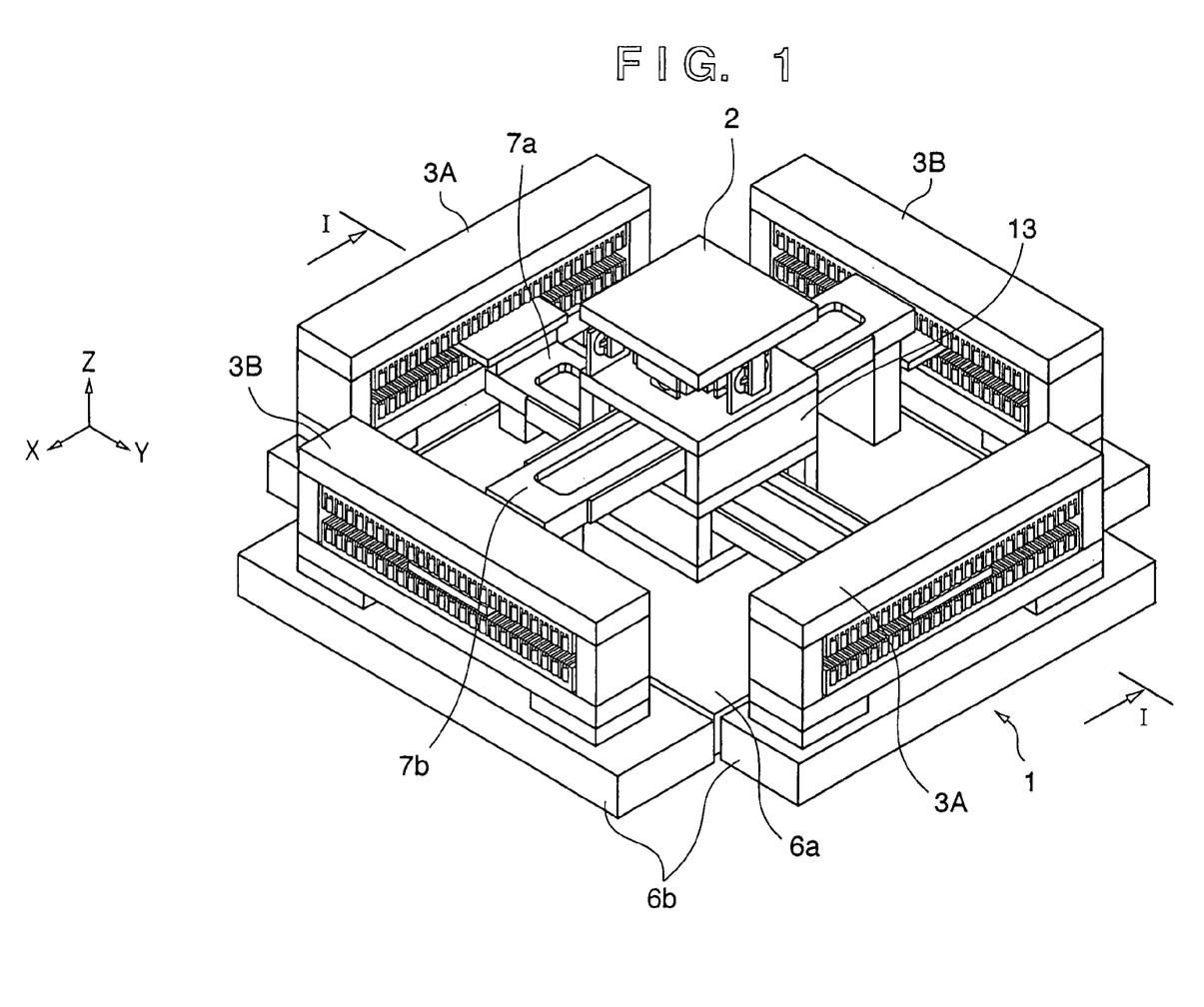
FIG. 1 is a perspective view showing an alignment apparatus according to the first embodiment of the present invention.

FIG. 1 is a perspective view showing an alignment apparatus according to the first embodiment of the present invention. FIG. 1 shows an application to a wafer stage mounted in a semiconductor exposure apparatus (to be described later) to align a wafer.

In FIG. 1, a wafer stage 1 serving as an alignment apparatus comprises a stage base 6a serving as the first support member having a reference surface, which axially supports a slider 13 as an object so as to allow the slider 13 to move in the X- and Y-axis directions, linear motors 3A and 3B serving as driving units, which move the slider 13 in at least one of the X- and Y-axis directions on the reference surface of the stage base 6a to align the slider 13 at a predetermined position, and stator bases 6b, which are provided separately from the stage base 6a to support the linear motors 3A and 3B.

The driving units comprise an X beam 7a and the X linear motors (for coarse adjustment) 3A serving as the first driving unit, which moves the slider 13 in the X-axis direction, and a Y beam 7b and the Y linear motors (for coarse adjustment) 3B serving as the second driving unit, which moves the slider 13 in the Y-axis direction almost perpendicular to the X-axis direction.

The stage base 6a auxiliary supports the slider 13 so as to allow the slider 13 to move in the X- and Y-axis directions while the stator bases 6b axially support the X linear motors 3A and Y linear motors 3B, respectively.

Figure 2:
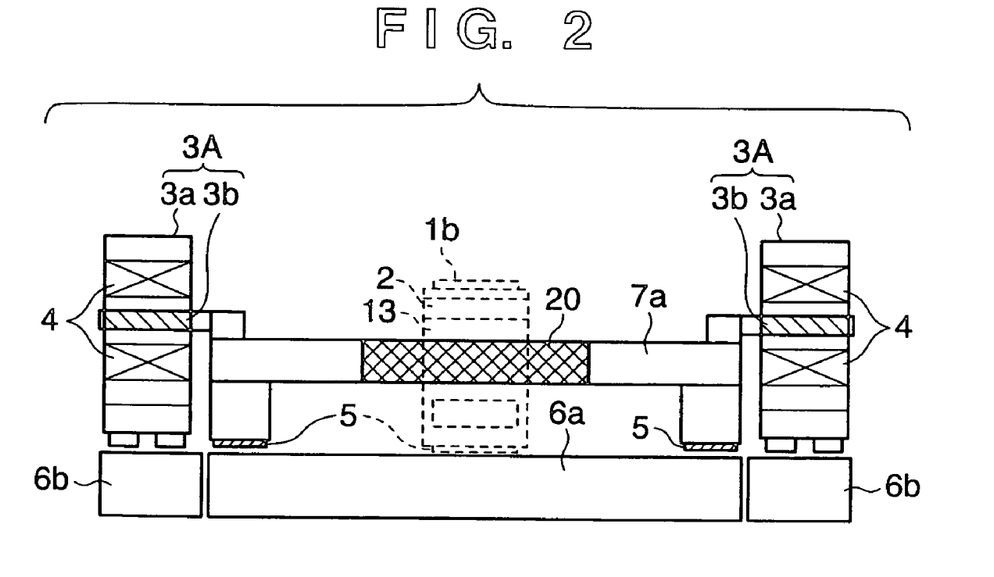
FIG. 2 is a schematic sectional view taken along the line I—I in FIG. 1.

FIG. 2 is a schematic sectional view when taken along the line I—I in FIG. 1.

In FIG. 2, each X linear motor 3A has an X movable element 3b, which moves the slider 13 in the X-axis direction and an X stator 3a, which applies a driving force to the X movable element 3b. Similarly, each Y linear motor 3B has a Y movable element 3b, which moves the slider 13 in the Y-axis direction and a Y stator 3a, which applies a driving force to the Y movable element 3b. These X and Y stators 3a are axially supported on the stator bases 6b through hydrostatic bearings 5.

Note that a fine adjustment stage 2 serving as a fine adjustment alignment apparatus is arranged on the slider 13 to align a substrate 1b (wafer) or a master (reticle or mask) at higher precision than the slider 13.

The four rectangular stator bases 6b are adjacent to and are isolated from the side surface positions of the square stage base 6a. The X linear motors 3A and Y linear motors 3B are supported by the hydrostatic bearings 5. The X linear motors 3A are supported on two of the stator bases 6a while the Y linear motors 3B are supported on the remaining stator bases 6b adjacent to the remaining parallel sides of the stage base 6a.

The X beam 7a extends between the two opposing X linear motors 3A in the Y-axis direction, and permanent magnets serving as the X movable elements 3b are fixed at both ends of the X beam 7a. Similarly, the Y beam 7b extends between the two opposing Y linear motors 3B in the X-axis direction, and permanent magnets serving as the Y movable elements 3b are fixed at both ends of the Y beam 7b.

The X beam 7a is driven in the X-axis direction by the X linear motors 3A while the Y beam 7b is driven in the Y-axis direction by the Y linear motors 3B. The slider 13 is arranged to be capable of moving along each of the X beam 7a and Y beam 7b.

Reference numeral 20 denotes a portion of each beam, which opposes the slider 13, and the portion is under particularly strict temperature control.

To prevent heat deformation of the wafer 1b, a wafer support member, such as a top plate, or the like, temperature control is performed most strictly for the surroundings of the wafer 1b, i.e., the vicinity of the fine adjustment stage 2 (including the temperature-controlled portions 20). In consideration of the exposure accuracy with respect to the wafer 1, heat deformation is desirably suppressed to be on the order of subnanometers (1 nm or less). That is, temperature control on the order of $1/1,000°$ C. is necessary. Conventionally, a temperature change around the wafer 1b is suppressed by blowing temperature-controlled air around the wafer. This method, however, is impracticable in an EUV or EB exposure apparatus because its wafer stage is arranged in a vacuum atmosphere. Under the circumstances, it is highly desirable to separate the vicinity of the wafer 1b from a heat source. In the alignment apparatus, the linear motors 3A and 3B generate more heat than the remaining portion. For this reason, in this embodiment, the X linear motors 3A and Y linear motors 3B are separated farthest from the fine adjustment stage 2.

To prevent heat generated in the X linear motors 3A and Y linear motors 3B from being directly transmitted to the X beam 7a and Y beam 7b, the permanent magnets are arranged at both ends of the X beam 7a and Y beam 7b to constitute the X and Y movable elements 3b (to be also referred to as movable elements 3b hereinafter). Also, exciting coils 4 of the X and Y stators 3a serving as heat sources are supported on the stator bases 6b.

The X and Y stators 3a (to be also referred to as stators 3a hereinafter), having the exciting coils 4 serving as heating elements, are arranged not on the stage base 6a, but on the stator bases 6b, which are isolated from the stage base 6a. This aims at minimizing transmission of heat generated in the stators 3a to the slider 13, and the like, through the stage base 6a. As a secondary effect, this also prevents a significant increase in size of the stage base 6a and, thus, facilitates the manufacture of the base. To eliminate influences of heat inflow from the stators 3a to the stator bases 6b, each stator 6b has a water-cooled pipe (not shown) serving as a cooling unit for cooling with a coolant such as water. Needless to say, providing a cooling unit to the stage base 6a can further suppress influences of heat on the movable elements.

In this embodiment, the stators 3a are axially supported on the stator bases 6b through the hydrostatic bearings 5. Noncontact support using a magnetic force for the purpose of minimizing heat flow from the stators 3a to the stators 6b, or use of a rolling mechanism or direct fixation for the purpose of accelerating the heat flow does not depart from the spirit and scope of the present invention.

The temperature of the stators 3a is assumed to rise to about 40 to 100° C. due to heat generation in the coils 4. For this reason, each of the movable elements 3b, which comprise the permanent magnets at both ends of the X beam 7a and Y beam 7b may receive radiant heat from the stator 3a, which opposes the movable element 3b in a noncontact manner. The quantity of heat flowing into the movable elements 3b caused by the radiation is generally several tens of W or less. For example, assume that the X beam 7a and Y beam 7b are supported in a noncontact manner using an electromagnetic force in a vacuum atmosphere. In this case, since there is almost no point for dissipating heat, the temperature of the beams 7a and 7b may rise by 10 to 40° C. Accordingly, to realize the purpose of providing heat dissipation points for the X beam 7a and Y beam 7b and the purpose of axially supporting the X beam 7a and Y beam 7b in a noncontact manner (without friction), in this embodiment, the X beam 7a and Y beam 7b are axially supported by the hydrostatic bearings 5 on the stage base 6a.

The hydrostatic bearings 5 axially support the beams 7a and 7b in a noncontact manner through a thin air layer of about 5 μm. Accordingly, the thermal resistance between the objects is low, although they are in noncontact with each other. For example, even if radiation heat of 10 W flows from each stator 3a into the beam 7a, a temperature rise of the beam can be suppressed to 2 to 3° C. or less by providing one hydrostatic bearing 5 of about 20 cm². Accordingly, axially supporting the beams 7a and 7b on the stage base 6a through the hydrostatic bearings 5 can dissipate to the stage base 6a radiant heat having been transferred from the stators 3a to the beams 7a and 7b. This can suppress a temperature rise of the beams.

The installation positions of the hydrostatic bearings 5 in the beams 7a and 7b influence a temperature rise of the temperature-controlled portions 20. A portion between the slider 13 and the movable element 3b of each of the beams 7a and 7b is supported by at least one hydrostatic bearing 5.

More specifically, the hydrostatic bearings 5 are provided between the temperature-controlled portions 20 and the movable elements 3b serving as points where (radiant) heat flows into the beams 7a and 7b. This arrangement can suppress a temperature rise in the temperature-controlled portions 20.

Also, when the thermal resistance from the hydrostatic bearings 5 to the temperature-controlled portions 20 in the vicinity of the slider 13 is made larger than that from the movable elements 3b to the hydrostatic bearings 5, a temperature rise of the temperature-controlled portions 20 can be suppressed.

In consideration of the above-mentioned effects, in the arrangement of FIG. 2, the hydrostatic bearings 5 are arranged for the beams 7a and 7b between the movable elements 3b and portion (temperature-controlled portions 20) opposing the slider 13 and as near the movable elements 3b as possible. To suppress influences of heat dissipated from the beams 7a and 7b to the stage base 6a, a water-cooled pipe (not shown) serving as a cooling unit for cooling, with a coolant such as water, is provided for the stage base 6a.

As will be described later, the hydrostatic bearings 5 are arranged to rapidly decrease the pressure of supplied air by a restrictor. A pad support unit 54 serving as a bearing unit shown in FIG. 4 causes air adiabatic expansion. This arrangement is advantageous in that the hydrostatic bearings 5 themselves produce an effect of cooling the beams.

[Hydrostatic Bearing]

The arrangement of each hydrostatic bearing 5 for use in a vacuum atmosphere will be described next with reference to FIGS. 4 and 5.

Figure 4:
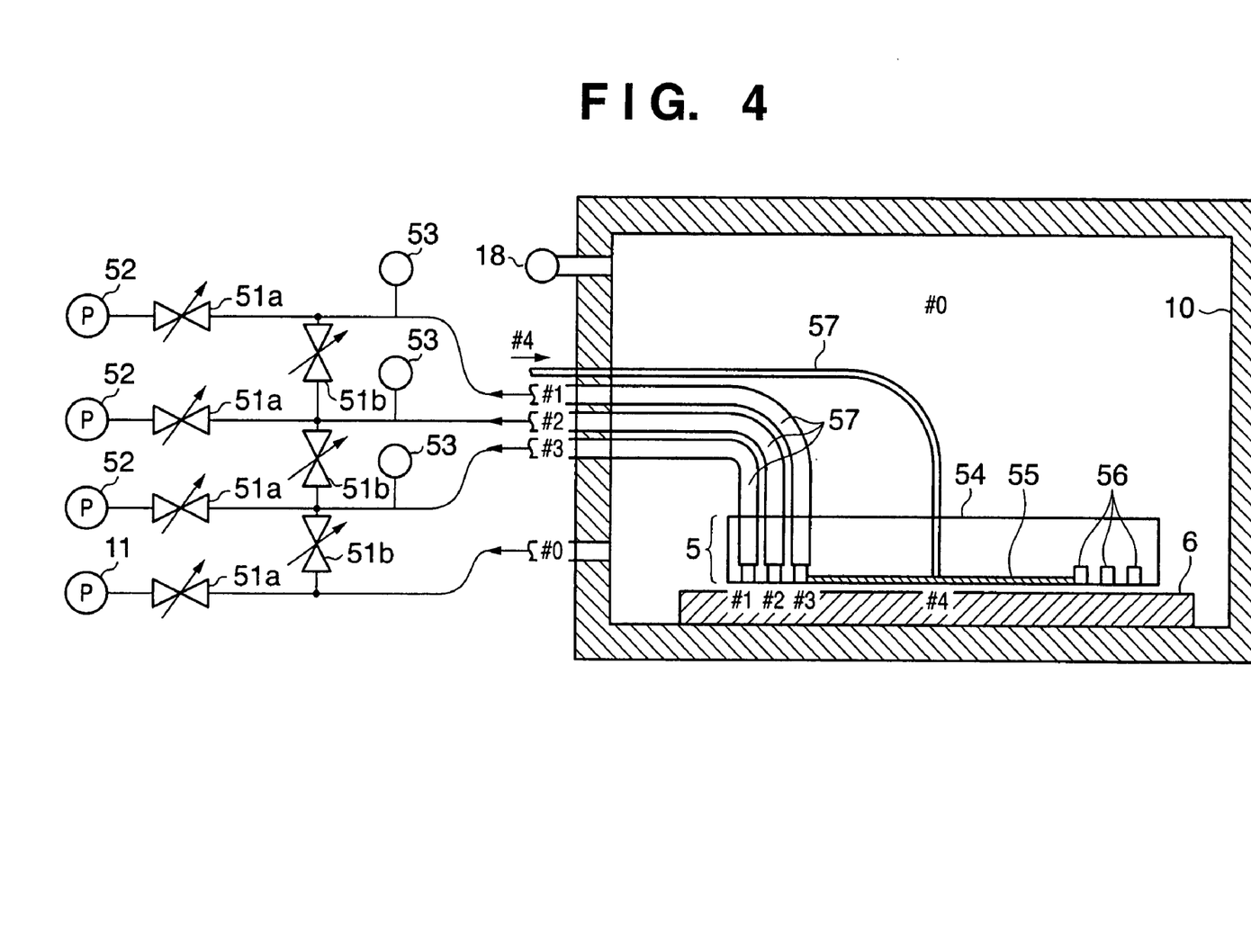
FIG. 4 is a view showing the arrangement of a hydrostatic bearing for use in a vacuum atmosphere.
Figure 5:
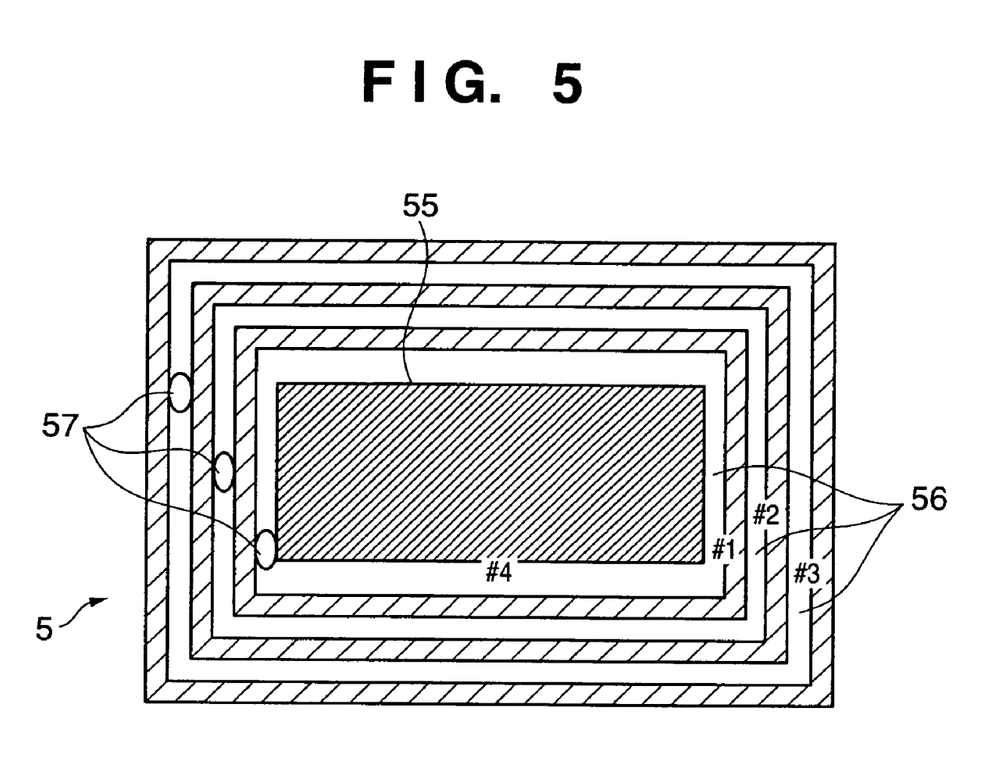
FIG. 5 is a view of the hydrostatic bearing as seen from the other side of a stage base in FIG. 4 (bottom surface)

FIG. 4 is a view showing the arrangement of the hydrostatic bearing 5 for use in the vacuum atmosphere, and FIG. 5 is a view of the hydrostatic bearing 5 as seen from the side of a stage base 6.

In FIGS. 4 and 5, vacuum pockets 56 are provided so as to surround a pad unit 55 made of a porous or aperture material in the hydrostatic bearing 5. The vacuum pockets #1 to #3 are evacuated by pumps 52 and valves 51a and 51b through pipes 57 and are kept at a predetermined vacuum degree by a pressure gas supplied through the pipes 57 to the pad unit 55 and a force generated by a pressurizing mechanism (not shown), the pad support unit 54 maintains a small gap between itself and the stage base 6. A gas injected from the pad unit (#4) generates a pressure difference between the vacuum pockets due to a low conductance of the small distance and is almost entirely recovered due to the evacuation in the vacuum pockets. That is, a gas supplied to the pad unit 55 does not influence the vacuum degree of a vacuum chamber 10.

The atmosphere in the chamber 10 (#10) is kept at a predetermined vacuum degree by a vacuum pump 11, the valves 51a and 51b, and the pressure gauges 18.

Even with the above-mentioned arrangement, which supports the beams with hydrostatic bearings 5, the temperature of the beam temperature-controlled portions 20 may rise by about 2 to 3° C. To increase the thermal resistance from the beam temperature-controlled portions 20 to the slider 13, the slider 13 is supported not by the hydrostatic bearings 5, but by an electromagnetic guide (not shown) so as to allow the slider 13 to move with respect to the beams. With this arrangement, only radiant heat transfers between the slider and the beams, and a temperature difference in this section is as small as 3° C. or less. For this reason, the quantity of the radiant heat is very small, and a temperature rise of the slider 13 can be suppressed to be on the order of $1/100°$ C.

The fine adjustment stage 2, arranged on the slider 13, is arranged to perform alignment in six axial directions, as disclosed in, e.g., Japanese Patent Laid-Open No. 2001-230178.

[Fine Adjustment Stage]

The detailed arrangement of the fine adjustment stage 2 on the slider 13 will be described with reference to FIG. 6.

Figure 6:
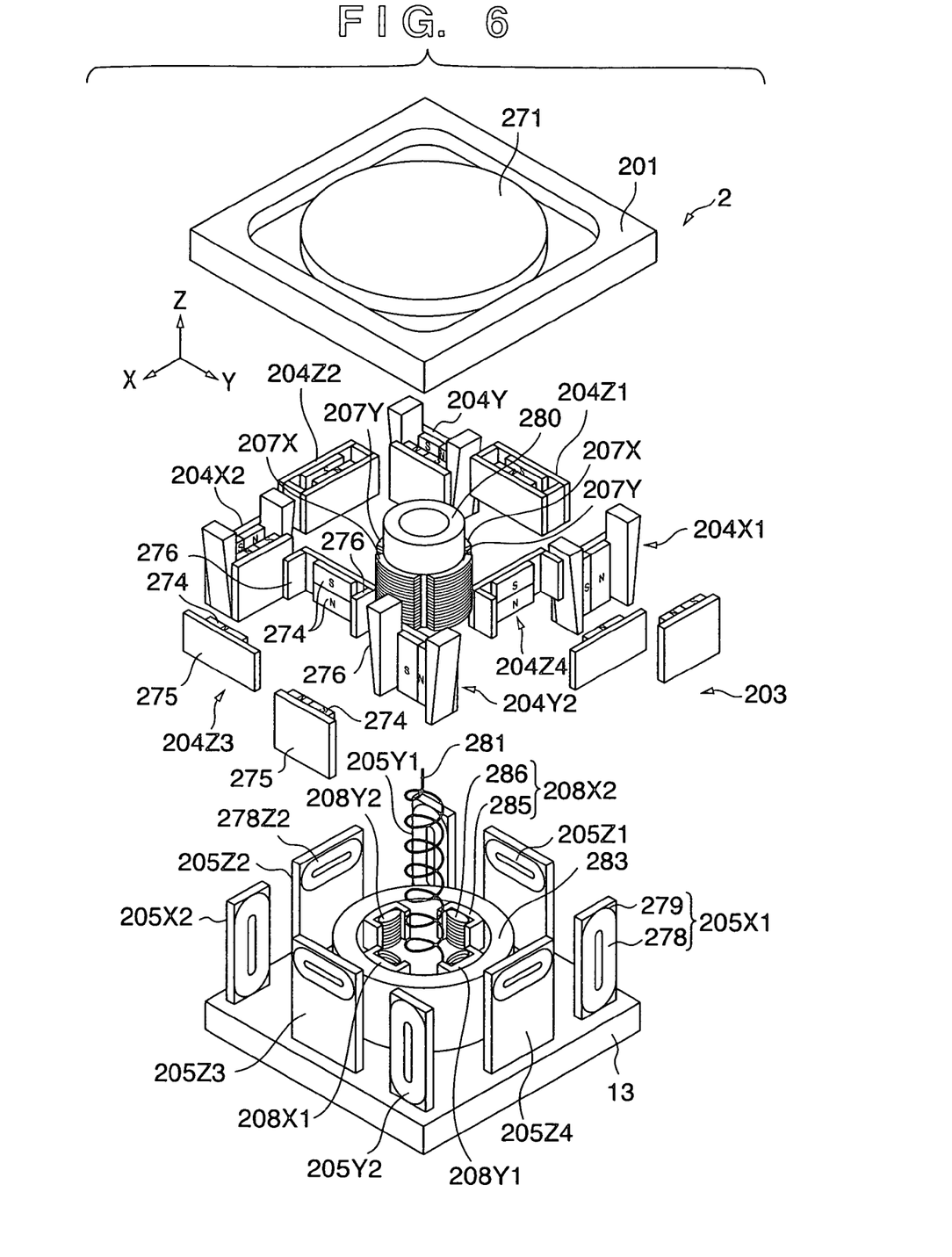
FIG. 6 is an exploded perspective view of a fine adjustment stage.

FIG. 6 is an exploded view of an actuator using fine movement linear motors 203, electromagnets 208, and the like.

In FIG. 6, one end of each of stators 205X1, 205X2, 205Y1, 205Y2, and 205Z1 to 205Z4 (to be also referred to as stators 205 hereinafter) of the eight fine movement linear motors 203 for controlling in six axial directions the position of a top plate 201, on which a wafer chuck 271 is provided to chuck and to hold a wafer, one end of each of four E electromagnets 208X1, 208X2, 208Y1, and 208Y2 (to be also referred to as E electromagnets hereinafter) supported on an electromagnet support cylinder 283 to give an acceleration in the X and Y directions to the wafer top plate 201, and one end of a light weight compensating spring 281 for supporting the light weight of the wafer top plate 201, and the like, are fixed to the upper portion of the slider 13.

The stators 205 are formed by supporting oblong coils 278 with coil fixing frames 279, respectively. The stators 205 are arranged to face, in a noncontact manner, linear motor movable elements 204X1, 204X2, 204Y1, 204Y2, and 204Z1 to 204Z4 (to be also referred to as movable elements 204 hereinafter), fixed on the lower surface of the wafer top plate 201. In each movable element 204, two yokes 275 on which magnets 274 are coupled by side plates 276, such that the magnets 274 face each other in a noncontact manner, thereby forming a hollow box-like structure.

The electromagnet support cylinder 283 is arranged almost at the center of the slider 13, and each of the four E electromagnets 208 inside the electromagnet support cylinder 283 comprises a magnetic block 285, which has an almost E-shaped section as seen in the Z direction, and a coil 286.

Each coil 286 is wound around the central projection of the E shape. The end faces of the three projections of the E shape are not linear, but arcuate. The end faces of the three projections of the E electromagnet 208 face a corresponding one of arcuate magnetic blocks 207X and 207Y fixed on the outer periphery of a magnetic body support cylinder 280 connected to the wafer top plate 201 in a noncontact manner through an air gap of about several tens of μm or more. By supplying a current to the coils 286, an attraction force acts on the arcuate magnetic blocks 207X and 207Y.

Importantly, the units between the top plate 201 and the slider 13 are basically arranged to be in noncontact with each other except for the light weight compensating spring 281 in order to increase the wafer alignment precision and to prevent heat transfer from the slider 13 to the top plate 201. If a magnetic force, such as a permanent magnet, is used to compensate for the light weight instead of the light weight compensating spring 281, the entire arrangement between the top plate 201 and the slider 13 can be implemented in a completely noncontact manner, and only radiant heat transfers between them. In this case, a temperature difference between the slider 13 and the top plate 201 is very small (on the order of 0.01° C.), and both of the quantity of the radiant heat and the quantity of heat transferred through the light weight compensating spring 281 can be reduced to a negligible level. The temperature of the top plate 201, i.e., the vicinity of a wafer can be controlled on the order of $1/1,000°$ C.

[Second Embodiment]

Figure 3:
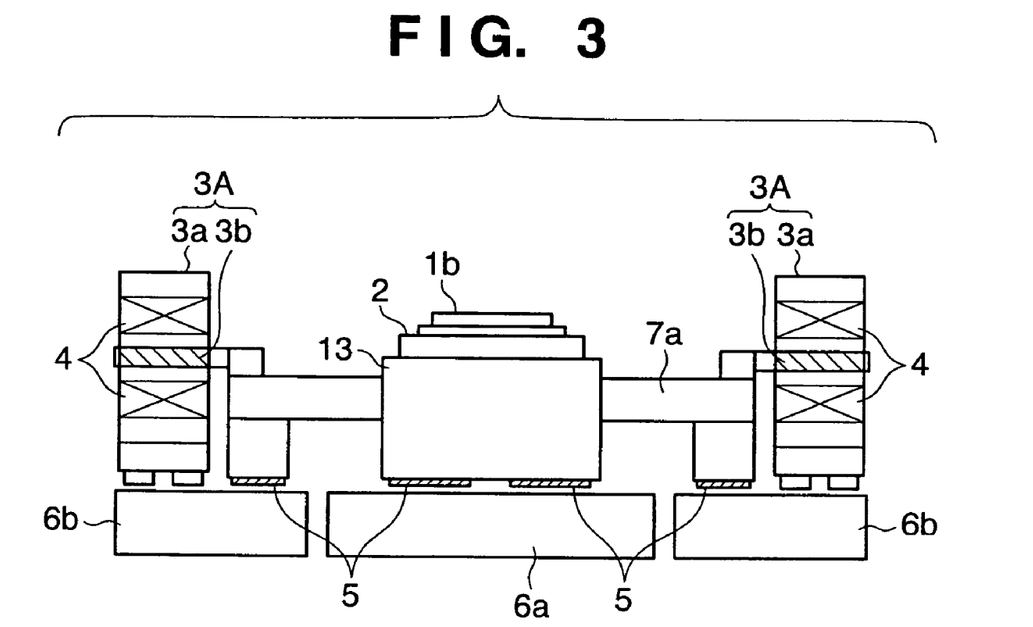
FIG. 3 is a view showing an alignment apparatus according to the second embodiment of the present invention in a manner corresponding to FIG. 2.

FIG. 3 is a view showing an alignment apparatus according to the second embodiment of the present invention in a manner corresponding to FIG. 2. FIG. 3 shows an application to a mask stage, which is mounted on a semiconductor exposure apparatus (to be described later), and aligns a mask.

A mask stage shown in FIG. 3 is an alignment apparatus for a mask 1a arranged in a vacuum atmosphere. A beam 7a (or 7b) and a slider 13 are rigidly connected and can move in only one axial direction, i.e., the X-axis direction (or Y-axis direction). For this reason, the slider 13 itself serves as a temperature-controlled portion 20. A six-axial fine adjustment stage 2, as described in the first embodiment, is arranged on the slider 13.

Stators 3a, having exciting coils 4 and movable elements 3b having magnets, are provided to move the beams and slider. The stators 3a are supported through hydrostatic bearings 5 on stator bases 6b, which are isolated from a stage base 6a, which supports the slider 13.

To dissipate heat transmitted to the movable elements 3b upon radiation of heat generated in the exciting coils 4, the hydrostatic bearings 5 are provided for the beam 7a to support the stage base 6a. In the second embodiment, the hydrostatic bearings 5 provided for the beam 7a are arranged on the stator bases 6b to prevent heat dissipated through the hydrostatic bearings 5 from being transmitted to the fine adjustment stage 2, unlike the first embodiment.

The same reference numerals as those in FIGS. 1 and 2 denote parts having the same functions, and a description thereof will be omitted.

[Application to an Exposure Apparatus]

Figure 7:
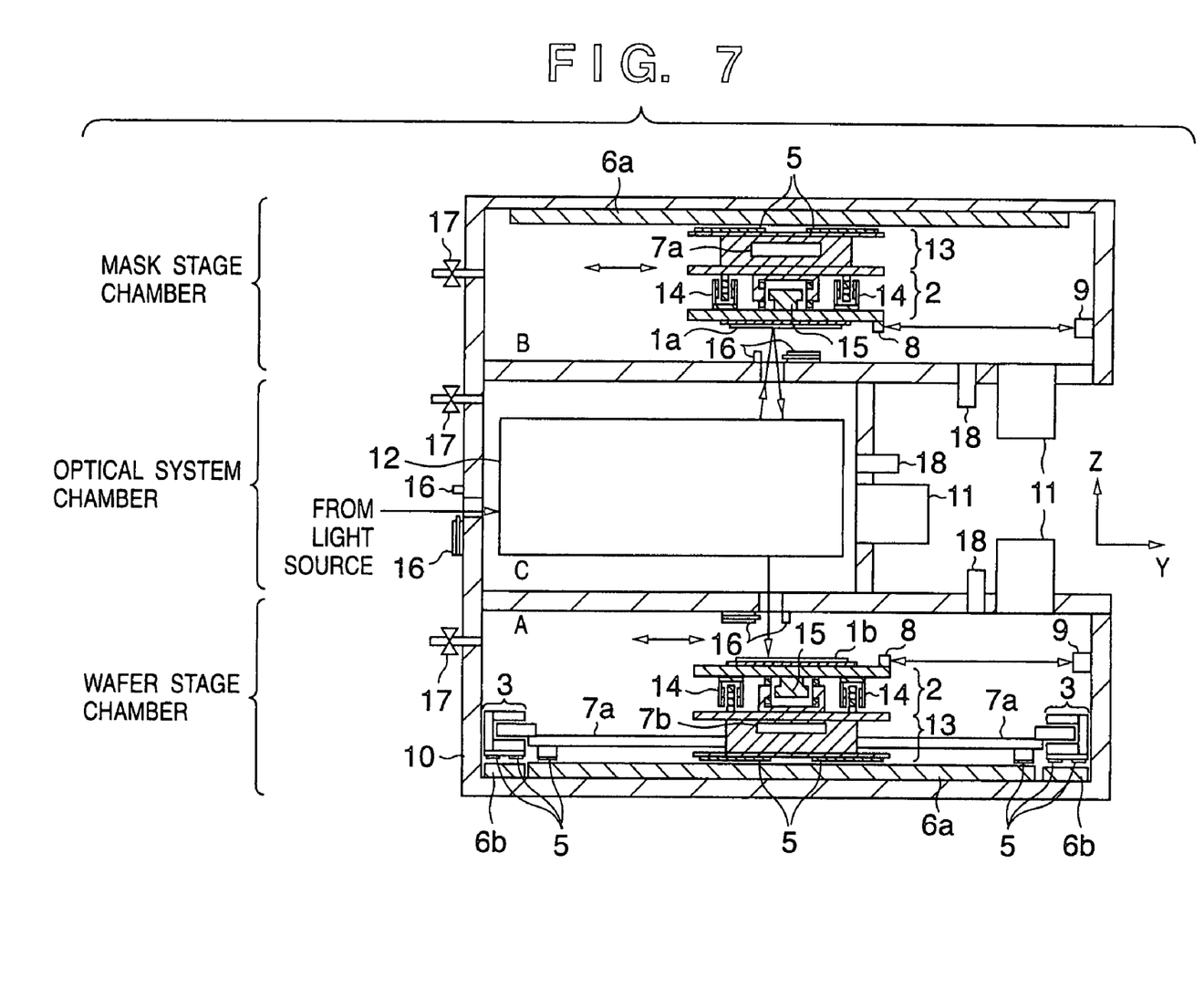
FIG. 7 is a view showing an application of an alignment apparatus according to an embodiment of the present invention to a semiconductor exposure apparatus.

FIG. 7 is a view showing the arrangement of an alignment apparatus mounted on an EUV exposure apparatus and its surroundings. The same reference numerals as those in FIGS. 1 and 2 denote parts having the same functions.

In an EUV exposure apparatus shown in FIG. 7, a chamber 10 is partitioned into a wafer stage chamber space A, a mask stage chamber space B, and an optical system chamber space C. The atmospheres in the chamber spaces A, B, and C are kept at predetermined vacuum degrees by vacuum pumps 11 and pressure gauges 18.

In the wafer stage chamber space A, an alignment apparatus having the arrangement of the above-mentioned first embodiment is placed. One of the fine adjustment stages 2 is provided on one of the sliders 13 and can move by one of the fine movement linear motors 14 and one of the electromagnetic couplings 15. The position of the fine adjustment stage 2 is measured by one of interferometer mirrors 8 and one of interferometers 9.

In the mask stage chamber space B, an alignment apparatus having the arrangement of the above-mentioned second embodiment is placed. The other fine adjustment stage 2 is provided on the other slider 13 and can move by the other fine movement linear motor 14 and the other electromagnetic coupling 15. The position of the fine adjustment stage 2 is measured by the other interferometer mirror 8 and the other interferometer 9.

In the optical system chamber space C, an imaging optical system 12 is placed. A wafer 1b is exposed to a circuit pattern formed on a mask 1a with EUV light emitted from an exposure light source (not shown).

The chamber spaces A, B, and C are partitioned so as to communicate with each other through vacuum valves 16 for maintenance reasons. The vacuum valves 16 are opened or closed in accordance with whether in exposure or in non-exposure, or for the maintenance of the chambers. The vacuum valves 16 are provided for the optical system chamber space C on the sides of the wafer stage chamber space A and mask stage chamber space B, respectively. The chamber spaces can independently be evacuated or opened to the outer space by the vacuum pumps 11, leak valves 17, and the pressure gauges 18.

With the above-mentioned arrangement, the alignment apparatuses align a wafer or mask, or both of them, thereby exposing the wafer to a pattern on the mask.

The same reference numerals as those in FIGS. 1 and 2 denote parts having the same functions, and a description thereof will be omitted.

The present invention is not limited to the above embodiments and various changes and modifications can be made within the spirit and scope of the present invention. Therefore, to apprise the public of the scope of the present invention, to the following claims are made.

What is claimed is:

1. An exposure apparatus which exposes a pattern on a mask to a substrate in a vacuum atmosphere, said apparatus comprising:
    a first support member having a surface;
    an object which mounts at least one of the substrate and the mask;
    a beam which moves said object on the surface;
    a drive which drives the beam;
    a second support member which is provided separately from said first support member and supports a heating unit of said drive; and
    a hydrostatic bearing which supports said beam on one of said first and second support members,
    wherein said hydrostatic bearing has (i) a pad unit which is provided on said beam and injects a gas, (ii) a vacuum pocket which is provided so as to surround the pad unit and (iii) means for evacuating the gas in the vacuum pocket, and said hydrostatic bearing is provided between said object and said heating unit.

2. The apparatus according to claim 1, wherein said beam comprises:
    a first beam which moves said object in a first direction; and
    a second beam which moves said object in a second direction perpendicular to the first direction,
    wherein said first support member supports said object so as to allow said object to move in the first and second directions.

3. The apparatus according to claim 2, wherein said drive comprises:
    a first drive which drives first beam; and
    a second drive which drives second beam,
    wherein said first and second drives have movable magnets and stator coils, and said stator coils are supported on said second support member.

4. The apparatus according to claim 1, wherein said object is guided by a magnetic force in a non-contact manner with respect to the beam.

5. The apparatus according to claim 1, further comprising a cooling unit which cools at least said second support member.

6. The apparatus according to claim 1, further comprising a fine movement alignment apparatus which aligns one of the substrate and the mask at a higher precision than the one of the substrate and the mask arranged on said object.

7. The apparatus according to claim 1, wherein said drive has a coil unit and a magnet unit, and said second support member supports said coil unit.

* * * * *

UNITED STATES PATENT AND TRADEMARK OFFICE
CERTIFICATE OF CORRECTION

PATENT NO. : 7,154,588 B2 Page 1 of 1
APPLICATION NO. : 11/406442
DATED : December 26, 2006
INVENTOR(S) : Keiji Emoto It is certified that error appears in the above-identified patent and that said Letters Patent is hereby corrected as shown below:

ON THE COVER PAGE:
In item "(56) References Cited," under "FOREIGN PATENT DOCUMENTS," the last-listed document, "JP    200359797    2/2003" should read -- JP    2003-59797    2/2003 --.

Signed and Sealed this

Eighth Day of May, 2007

JON W. DUDAS
*Director of the United States Patent and Trademark Office*